(12) United States Patent
Nammi et al.

(10) Patent No.: US 11,171,668 B2
(45) Date of Patent: *Nov. 9, 2021

(54) ENCODING DATA WITH POLAR CODES FOR CONTROL CHANNELS

(71) Applicant: AT&T INTELLECTUAL PROPERTY I, L.P., Atlanta, GA (US)

(72) Inventors: SaiRamesh Nammi, Kista (SE); Xiaoyi Wang, Austin, TX (US); Arunabha Ghosh, Austin, TX (US)

(73) Assignee: AT&T INIELLECTUAL PROPERTY I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/830,397

(22) Filed: Mar. 26, 2020

(65) Prior Publication Data
US 2020/0228143 A1    Jul. 16, 2020

Related U.S. Application Data

(63) Continuation of application No. 16/356,577, filed on Mar. 18, 2019, now Pat. No. 10,637,504, which is a
(Continued)

(51) Int. Cl.
H03M 13/00 (2006.01)
H03M 13/13 (2006.01)
H04L 1/00 (2006.01)

(52) U.S. Cl.
CPC ............ *H03M 13/13* (2013.01); *H04L 1/001* (2013.01); *H04L 1/0002* (2013.01); *H04L 1/0072* (2013.01); *H04L 1/0026* (2013.01)

(58) Field of Classification Search
None
See application file for complete search history.

(56) References Cited

U.S. PATENT DOCUMENTS 6,915,473 B2   7/2005   Bolourchi et al.
7,480,269 B2   1/2009   Heo et al.
(Continued)

FOREIGN PATENT DOCUMENTS

EP    2263338 B1    9/2016
GB    2514623 A     12/2014
(Continued)

OTHER PUBLICATIONS

Trifonov et al., "Polar codes with dynamic frozen symbols and their Decoding by Directed Search", arXiv preprint arXiv:1307.2352, Jul. 12, 2013, pp. 1-11.
(Continued)

Primary Examiner — Mujtaba M Chaudry
(74) Attorney, Agent, or Firm — Amin, Turocy & Watson, LLP

(57) ABSTRACT

Various embodiments provide for encoding and decoding control link information with polar codes where the frozen bits of the information block can be set to the device identification number instead of being set to null. The frozen bits can be identified based on the type of polar code being used, and while the non-frozen bits can be coded with the channel state information, the frozen bits can be coded with the device ID. In an example where there are more frozen bits than bits in the device ID, the most reliable of the frozen bits can be coded with the device ID. In another example, the frozen bits can be set to the CRC bits, which can then be masked by the device ID.

20 Claims, 10 Drawing Sheets

Related U.S. Application Data continuation of application No. 15/402,106, filed on Jan. 9, 2017, now Pat. No. 10,277,252.

(56) References Cited

U.S. PATENT DOCUMENTS

| | | |
|---|---|---|
| 7,486,644 B2 | 2/2009 | Kim et al. |
| 7,899,079 B2 | 3/2011 | Yang |
| 8,102,853 B2 | 1/2012 | Ngo et al. |
| 8,149,835 B2 | 4/2012 | Kim et al. |
| 8,295,243 B2 | 10/2012 | Malladi et al. |
| 8,483,215 B2 | 7/2013 | Jonsson et al. |
| 8,625,516 B2 | 1/2014 | Lindoff et al. |
| 9,088,971 B2 | 7/2015 | Anderson et al. |
| 9,154,464 B2 | 10/2015 | Tenny |
| 9,419,832 B2 | 8/2016 | Yamada et al. |
| 9,485,052 B2 | 11/2016 | Chung et al. |
| 2006/0291403 A1 | 12/2006 | Kahtava et al. |
| 2007/0155390 A1 | 7/2007 | Kodikara Patabandi et al. |
| 2008/0205349 A1 | 8/2008 | Kim et al. |
| 2013/0117344 A1* | 5/2013 | Gross .............. H03M 13/1575 708/490 |
| 2013/0173993 A1* | 7/2013 | Fujimoto .............. G06F 11/10 714/764 |
| 2013/0301587 A1 | 11/2013 | Luo et al. |
| 2014/0019820 A1* | 1/2014 | Vardy .................. H03M 13/13 714/752 |
| 2014/0328256 A1 | 11/2014 | Djukic et al. |
| 2015/0009952 A1 | 1/2015 | Berggren et al. |
| 2015/0055591 A1* | 2/2015 | Kang .................. H04L 5/0073 370/329 |
| 2015/0092894 A1* | 4/2015 | Yokokawa ........ H03M 13/2936 375/341 |
| 2015/0358113 A1* | 12/2015 | Callard ................ H04L 1/0041 714/776 |
| 2016/0013810 A1 | 1/2016 | Gross et al. |
| 2016/0285479 A1* | 9/2016 | El-Khamy .......... H03M 13/616 |
| 2016/0329989 A1 | 11/2016 | Li et al. |
| 2017/0047947 A1* | 2/2017 | Hong ................ H03M 13/2906 |
| 2017/0289971 A1 | 10/2017 | Wu et al. |
| 2017/0366199 A1 | 12/2017 | Ge et al. |
| 2017/0367046 A1 | 12/2017 | Papasakellariou |
| 2018/0007683 A1 | 1/2018 | You et al. |

FOREIGN PATENT DOCUMENTS

| | | |
|---|---|---|
| WO | 2009156798 A1 | 12/2009 |
| WO | 2013107140 A1 | 7/2013 |
| WO | 2014173133 A1 | 10/2014 |
| WO | 2015019182 A2 | 2/2015 |
| WO | 2016159847 A1 | 10/2016 |

OTHER PUBLICATIONS

Li et al., "An Adaptive Successive Cancellation list decoder for Polar Codes with Cyclic Redundancy Check", IEEE Communications Letters, vol. 16, No. 12, Dec. 2012, pp. 2044-2047.

Sarkis et al., "Increasing the speed of polar list decoders", IEEE Workshop on Signal Processing Systems (SiPS). IEEE, 2014, pp. 1-6.

Bonik et al., "A variant of list plus CRC concatenated polar code", arXiv preprint arXiv: 1207.4661, Jul. 19, 2012, 4 pages.

Non-Final Office Action received for U.S. Appl. No. 15/402,106 dated Jan. 9, 2018, 20 pages.

Final Office Action received for U.S. Appl. No. 15/402,106 dated Aug. 8, 2018, 15 pages.

Non-Final Office Action received for U.S. Appl. No. 16/356,577 dated Sep. 19, 2019, 22 pages.

U.S. Appl. No. 16/356,577, filed Mar. 18, 2019.

U.S. Appl. No. 15/402,106, filed Jan. 9, 2017.

* cited by examiner

ENCODING DATA WITH POLAR CODES FOR CONTROL CHANNELS

RELATED APPLICATIONS

The subject patent application is a continuation of, and claims priority to each of, U.S. patent application Ser. No. 16/356,577 (now U.S. Pat. No. 10,637,504), filed Mar. 18, 2019, and entitled "ENCODING DATA WITH POLAR CODES FOR CONTROL CHANNELS," which is a continuation of U.S. patent application Ser. No. 15/402,106 (now U.S. Pat. No. 10,277,252), filed Jan. 9, 2017, and entitled "ENCODING DATA WITH POLAR CODES FOR CONTROL CHANNELS," the entireties of which applications are hereby incorporated by reference herein.

TECHNICAL FIELD

The disclosed subject matter relates to encoding and decoding control data for uplink and downlink control channels using polar codes to enable improvement of wireless system performance over conventional wireless system technologies, e.g., for fifth generation (5G) technologies or other next generation networks.

BACKGROUND

To meet the huge demand for data centric applications, third generation partnership project (3GPP) systems and systems that employ one or more aspects of the specifications of fourth generation (4G) standards for wireless communications will be extended to fifth generation (5G) standards for wireless communications. Unique challenges exist to provide levels of service associated with forthcoming 5G and/or other next generation standards for wireless networks.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
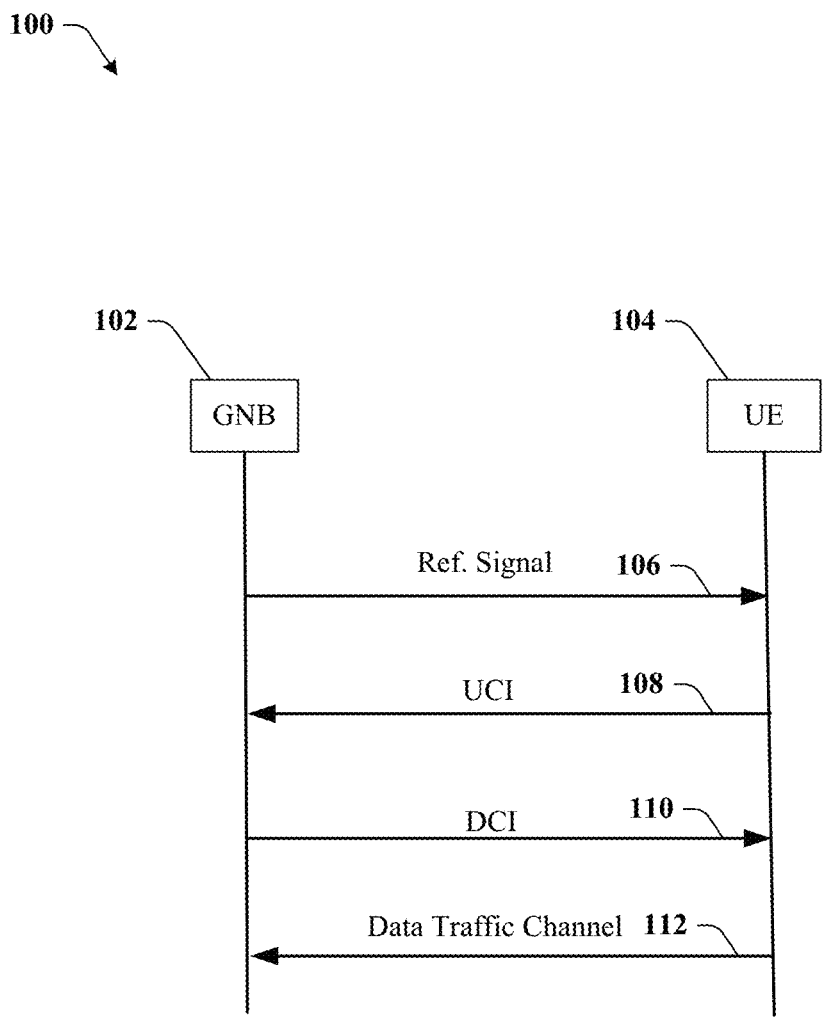
FIG. 1 illustrates an example schematic diagram of a message sequence chart for uplink and downlink control information in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

In an embodiment, a system can comprise a processor and a memory that stores executable instructions that, when executed by the processor, facilitate performance of operations, including determining locations of frozen bits in a control channel information block, wherein the locations of the frozen bits are determined based on a type of forward error correction code. The operations can also include coding non-frozen bits of the control channel information block with control data to facilitate a data transmission. The operations can also include coding the frozen bits of the control channel information block with an identification number associated with a mobile device, resulting in bits coded with the identification number.

In another embodiment, a method can include determining, by a device comprising a processor, respective reliabilities of bit locations in a control channel information block, the reliabilities determined based on a type of polar forward error correction code. The method can also coding, with control data and by the device, a first group of the bit locations determined to have reliabilities above a first reliability threshold, wherein the control data comprises channel state information. The method can also include coding, with an identification number associated with a mobile device and by the device, a second group of bit locations determined to have reliabilities below a second reliability value.

In another embodiment, a machine-readable storage medium, comprising executable instructions that, when executed by a processor of a device, facilitate performance of operations. The operations can include determining respective reliabilities of bit locations in a control channel information block, the reliabilities determined based on a type of polar forward error correction code. The operations can also include setting a first group of bit locations determined to have reliabilities above a predetermined reliability threshold to match control data bits comprising channel state information. The operations can also include setting a second group of bit locations determined to have reliabilities below the predetermined reliability threshold to match bits associated with an identification number of a mobile device.

The operations can also include encoding the control channel information block with the polar forward error correction code.

Forward error correction codes can be used to improve the performance of communications channels by protecting the integrity of the information bits from interference, multipath fading, additive white Gaussian noise (AWGM) etc. In an embodiment polar forward error correction codes can be used in 5G wireless communication systems in order to protect control link channels, uplink and downlink. Polar codes, achieve the symmetric capacity of arbitrary binary-input discrete memory-less channels under a low complexity successive cancellation decoding strategy. When using polar codes, the reliability of certain bit locations in an information block can vary, and so, information that is to be protected can be coded into the bit locations that are above a predetermined reliability. Other bit locations, below the predetermined reliability threshold, are called "frozen bits" and are generally set as null bits and do not carry the payload data.

In legacy systems, cyclic redundancy check bits are appended to information blocks in order to detect changes to raw data. The cyclic redundancy check (CRC) bits can be masked with the device ID of the user equipment or base station device to which the transmission is directed. In this way, devices which are not being addressed will be unable to decode the transmissions. In 5G systems, however, the control channel will be split into a plurality of stages however, and so including the CRC bits in front of each stage will slow down throughput and increase the resources needed to perform control signaling.

In an embodiment therefore, a system for encoding and decoding control link information with polar codes is provided where the frozen bits of the information block can be set to the device identification number instead of being set to null. The frozen bits can be identified based on the type of polar code being used, and while the non-frozen bits can be coded with the channel state information, the frozen bits can be coded with the device ID. In an embodiment where there are more frozen bits than bits in the device ID, the most reliable of the frozen bits can be coded with the device ID. In another embodiment, the frozen bits can be set to the CRC bits, which can then be masked by the device ID.

Turning now to FIG. 1, illustrated is an example schematic diagram of a message sequence chart 100 for uplink and downlink control information in accordance with various aspects and embodiments of the subject disclosure. In an embodiment, a gNodeB 102 can send a reference signal 106 to a UE 104. The reference signal can be beamformed in some embodiments, or non beamformed in other embodiments.

Based on the reference signal 106, the UE 104 can measure the channel response, and determine channel state information (CSI) to give as feedback to the gNodeB 102. The channel state information can include a channel quality indicator, precoding matrix index, or advanced PMI. This channel state information can refer to the known channel properties of the communication link between the gNodeB 102 and the UE 104. The channel properties can reflect how the signal propagates from the transmitter to the receiver and represents the combined effect of, for example, scattering, fading, and power decay with distance.

Once the channel state information is assembled, the UE 104 can transmit the UCI 108 to the gNodeB 102. Based, on the UCI 108, the gNodeB 102 can then send downlink control information (DCI) 110 to the UE 104 which enables the UE to send the data over the data traffic channel 112.

In an embodiment, the UCI 108 and DCI 110 can be encoded using polar codes. Polar codes can be linear block error correcting codes that are constructed based on a multiple recursive concatenation of a short kernel code which transforms the physical channel into virtual outer channels. When the number of recursions becomes large, the virtual channels or bit locations tend to either have high reliability or low reliability (in other words, they polarize), and the data bits are allocated to the most reliable bit locations. Therefore, in an embodiment, the channel state information contained in the UCI 108 and DCI 110 can be allocated to the reliable bit locations, while the device ID information can be allocated to the less reliable bit locations.

In an embodiment, the bit locations that have a reliability below a predetermined reliability level can be called frozen bits, while the bit locations that are above the predetermined reliability level can be call non-frozen bits, and be allocated to the payload data (e.g., channel state information). In an embodiment, the device ID can be 16 bits, and the predetermined reliability level can be set such that there are at least 16 bit locations below the reliability level such that there are enough frozen bit locations to accommodate the device ID. In embodiments where there are more than 16 frozen bits, or more frozen bits than device ID bits, the device ID can be allocated to the most reliable of the frozen bits. The remainder of the frozen bits can then be set to a fixed value (e.g., "0"). In at least one embodiment, the frozen bits can incorporate the CRC bits, which can then be masked with the device ID.

Figure 2:
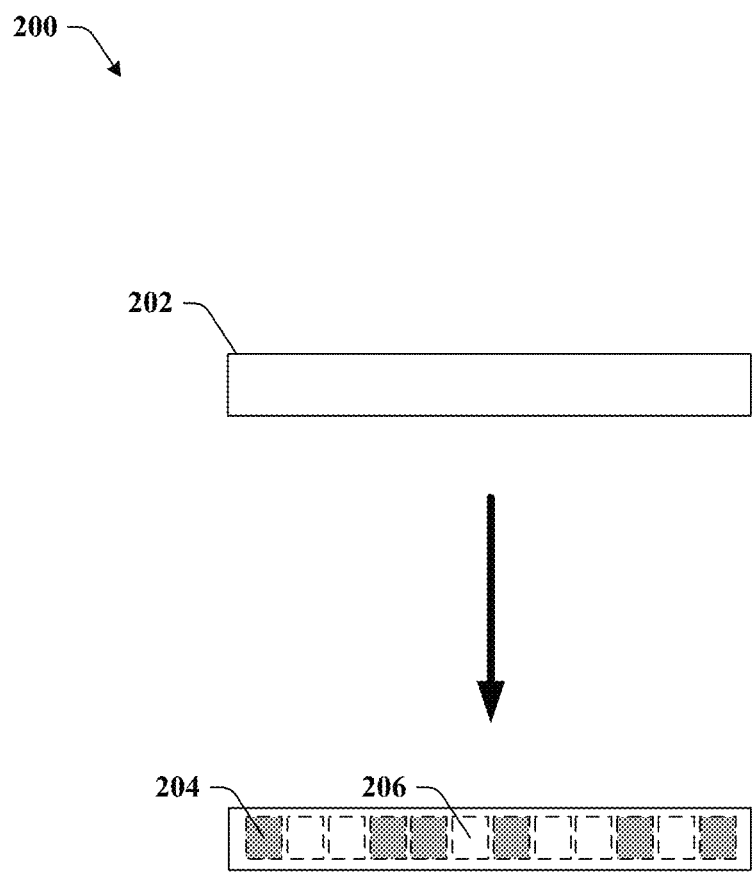
FIG. 2 illustrates an example block diagram of a control channel information block with frozen and non-frozen bits in accordance with various aspects and embodiments of the subject disclosure.

Turning now to FIG. 2, illustrated is an example block diagram 200 of an uplink control block with variable CRC bits in accordance with various aspects and embodiments of the subject disclosure. In an embodiment, a transmitter can determine the reliability of various bit locations in an information block 202 of control information and identify which bits are non-frozen bits e.g., bit 206, and which bits are frozen, e.g., bit 204.

The system can identify which bits are frozen based on determining a reliability of each of the bit locations. The system can estimate the reliability based on signal to noise ratio at each of the bit locations or can perform fixed weight computations at each of the bit locations. In other embodiments, the system can use Bhattacharyya bounding which measures the similarity of two discrete or continuous probability distributions.

The system can rank the reliability (or the probability of a decoding error upon transmission of the information block 202) at each bit location, and bit locations with reliabilities above a predetermined threshold (i.e., probability of error below a specified level) will be non-frozen bits, chosen to transport the payload data of channel state information. Bit locations with reliabilities below the predetermined threshold (i.e., probability of error above the specified level) will be frozen bits, and will be coded with the device ID, or set to CRC bits which will then be masked with the device ID.

In an embodiment, the bit locations can be based on the type of polar code selected to encode/decode the control channels. Different polar codes, based on the encoding/decoding process, may have different locations that have different reliabilities. Similarly, for a given polar code, information blocks of different lengths may have different frozen and non-frozen bit locations.

Figure 3:
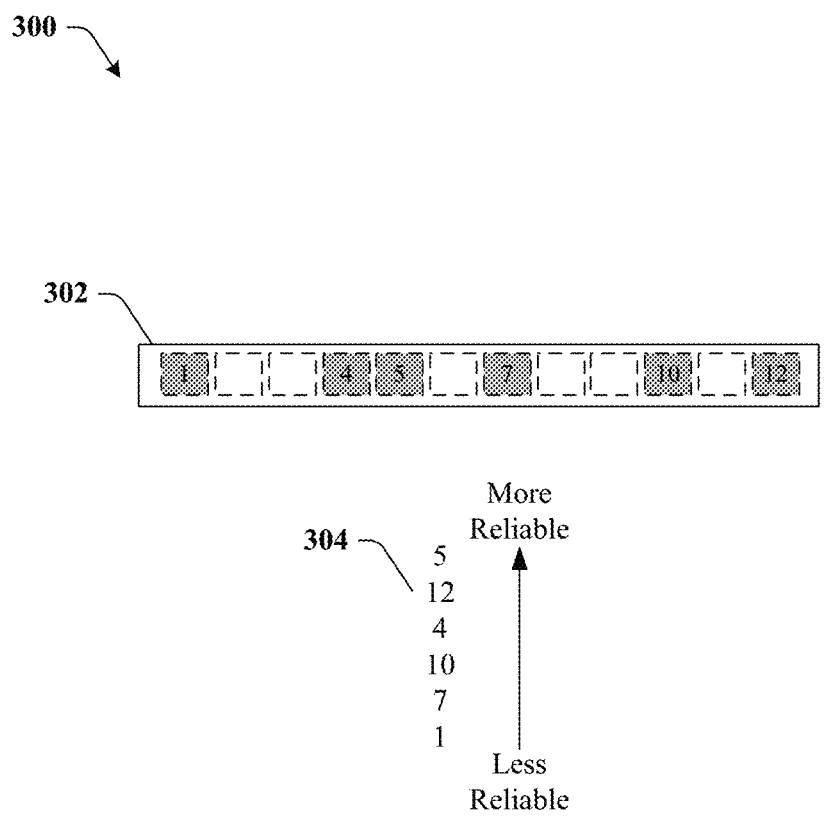
FIG. 3 illustrates an example block diagram of a control channel information block with frozen bits ranked in reliability in accordance with various aspects and embodiments of the subject disclosure.

Turning now to FIG. 3, illustrated is an example block diagram 300 of a control channel information block with frozen bits ranked in reliability in accordance with various aspects and embodiments of the subject disclosure.

The system can rank the reliability (or the probability of a decoding error upon transmission of the information block 302) at each bit location, and bit locations with reliabilities above a predetermined threshold (i.e., probability of error below a specified level) will be non-frozen bits, chosen to transport the payload data of channel state information. Bit locations with reliabilities below the predetermined threshold (i.e., probability of error above the specified level) will be frozen bits, and will be coded with the device ID, or set to CRC bits which will then be masked with the device ID.

In an embodiment, the system can determine that in information block 302 with 12 bit locations, there are 6 frozen bits, at bit locations 1, 4, 5, 7, 10, and 12. It is to be appreciated that in certain embodiments, the size of the information block 302 can be larger or smaller, with different numbers and proportions of frozen bits to non-frozen bits. In general, the size of the information block is large enough that the number of frozen bits is at least equal to the number of bits in the device ID (e.g., 16 bits in an embodiment).

In an embodiment, the system can rank the reliability of the frozen bit locations at 304. In an embodiment, the bit location can be ranked, in order of highest reliability to lowest reliability: 4, 5, 12, 10, 7, 1. In an embodiment, to improve throughput and reduce the probability of the device ID being corrupted, if the device ID is 3 bits long, bit locations 4, 5, and 12 can be selected to encode the device ID. In this way, the most reliable of the bit locations are used to code the device ID.

In an embodiment, the device ID can be encoded based on the order of the frozen bit locations within the information block. For instance, if the device ID is 3 bits long, the 3 most reliable bit locations in the information block 302 can be selected in which to code the device ID, i.e., bit locations 5, 12, and 4. In this embodiment, the device ID of 1-2-3 can be coded into bit locations 4, 5, and 12 respectively.

In other embodiments, the device ID can be encoded based on the reliability ranking. In this embodiment, the device ID of 1-2-3 can be coded into bit locations 5, 12, and 4 respectively. The decoder on the receiver side, can rank the reliability of the bit locations in order to determine the correct order of the device ID encoded in the frozen bit locations in order to decode the encoded code word.

Figure 4:
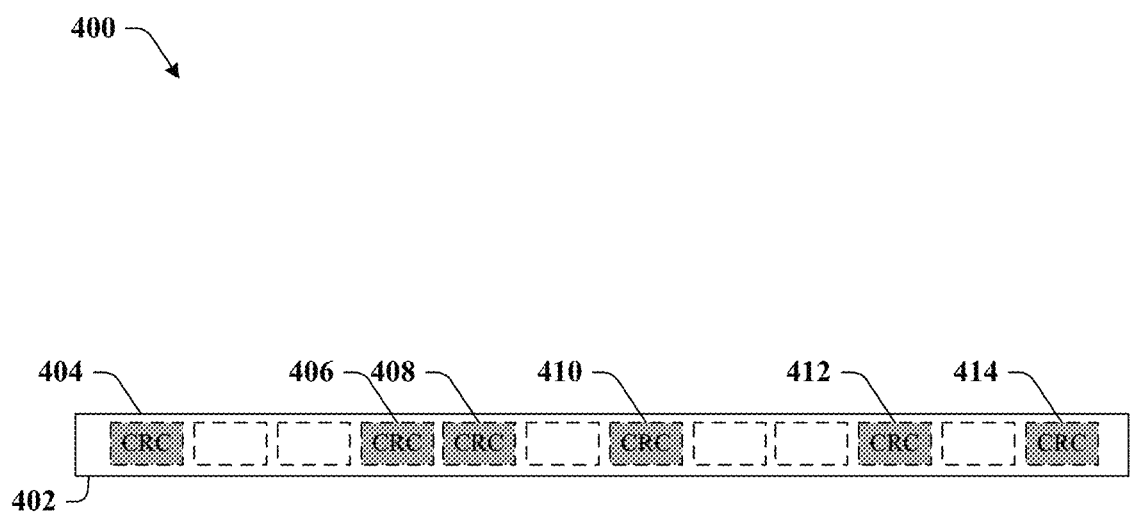
FIG. 4 illustrates an example block diagram of frozen bits coded with cyclic redundancy check bits in accordance with various aspects and embodiments of the subject disclosure.

Turning now to FIG. 4, illustrated is an example block diagram 400 of frozen bits coded with cyclic redundancy check bits in accordance with various aspects and embodiments of the subject disclosure.

In an embodiment, the frozen bit locations of information block 402 can be mapped with CRC bits at 404, 406, 408, 410, 412, and 414. The cyclic redundancy check (CRC) bits can be masked with the device ID of the user equipment or base station device to which the transmission is directed. In this way, devices which are not being addressed will be unable to decode the transmissions.

In an embodiment, the CRC bits can be masked with the UE ID, and then mapped to the frozen bit locations. In some embodiments, the CRC bits can be masked by performing a logical exclusive-or between the CRC bits and the UE ID.

Figure 5:
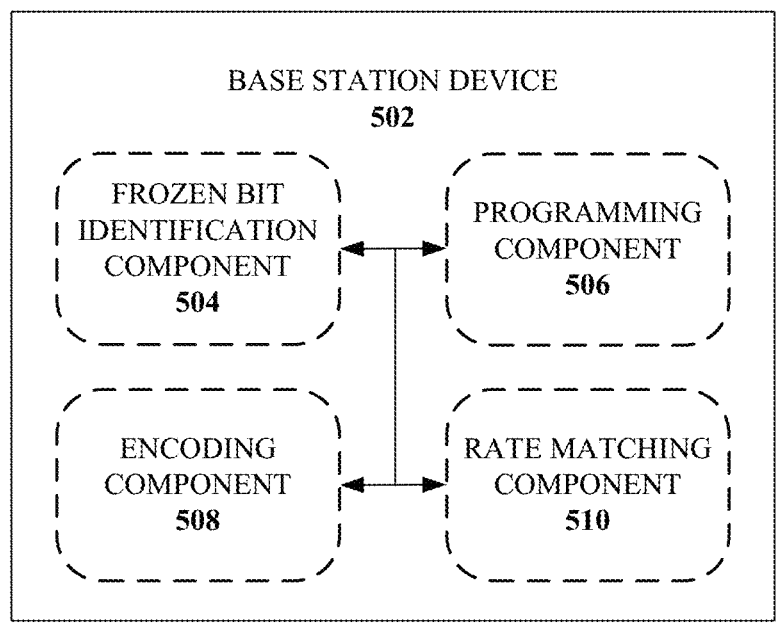
FIG. 5 illustrates an example block diagram of a base station device that facilitates encoding control channel data with a polar code in accordance with various aspects and embodiments of the subject disclosure.

Turning now to FIG. 5, illustrated is an example block diagram 500 of a base station device 502 that facilitates encoding control channel data with a polar code in accordance with various aspects and embodiments of the subject disclosure.

The base station device 502 can include a frozen bit identification component 604 that is configured to determine locations of frozen bits in a control channel information block, wherein the locations of the frozen bits are determined based on a type of forward error correction code. The base station device can also include a programming component 506 that is configured to code non-frozen bits of the control channel information block with control data to facilitate a data transmission and code the frozen bits of the control channel information block with an identification number associated with a mobile device, resulting in bits coded with the identification number.

In embodiment, the base station device 502 can also include an encoding component that encodes the control channel information block with the forward error correction code into a codeword equal in length to a sum of the frozen bits and the non-frozen bits. The base station device 502 can also include a rate matching component 510 that can split the codeword into partial codewords to facilitate rate matching.

The frozen bit identification component 604 can identify which bits are frozen based on determining a reliability of each of the bit locations. The frozen bit identification component 604 can estimate the reliability based on signal to noise ratio at each of the bit locations or can perform fixed weight computations at each of the bit locations. In other embodiments, the frozen bit identification component 604 can use Bhattacharyya bounding which measures the similarity of two discrete or continuous probability distributions.

The frozen bit identification component 604 can rank the reliability (or the probability of a decoding error upon transmission of the information block) at each bit location, and bit locations with reliabilities above a predetermined threshold (i.e., probability of error below a specified level) will be non-frozen bits, chosen to transport the payload data of channel state information.

In an embodiment, the bit locations can be based on the type of polar code selected to encode/decode the control channels. Different polar codes, based on the encoding/decoding process, may have different locations that have different reliabilities. Similarly, for a given polar code, information blocks of different lengths may have different frozen and non-frozen bit locations.

The programming component 506 can program frozen bit locations with the device ID based on the order of the frozen bit locations within the information block. For instance, if the device ID is 3 bits long, the 3 most reliable bit locations in the information block can be selected in which to code the device ID, i.e., bit locations 5, 12, and 4 (from FIG. 3). In this embodiment, the device ID of 1-2-3 can be coded into bit locations 4, 5, and 12 respectively.

In other embodiments, the device ID can be programmed by the programming component 506 based on the reliability ranking. In this embodiment, the device ID of 1-2-3 can be coded into bit locations 5, 12, and 4 respectively. The decoder on the receiver side, can rank the reliability of the bit locations in order to determine the correct order of the device ID encoded in the frozen bit locations in order to decode the encoded code word.

Figure 6:
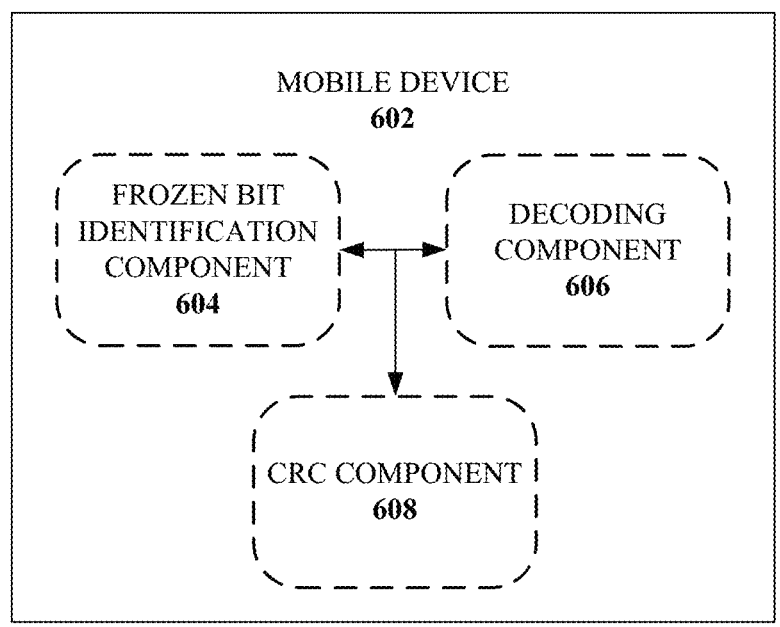
FIG. 6 illustrates an example block diagram of a mobile device that decodes control channel data with a polar code in accordance with various aspects and embodiments of the subject disclosure.

Turning now to FIG. 6, illustrated is an example block diagram 600 of a mobile device 602 that decodes control channel data with a polar code in accordance with various aspects and embodiments of the subject disclosure.

In an embodiment, the mobile device 602 can include a frozen bit identification component 604 that can determine locations of frozen bits in a control channel information block, wherein the locations of the frozen bits are determined based on a type of polar code. The base station device can also include a decoding component 606 that is configured to decode the codeword that comprises the encoded control channel information block1 using the device ID in the place of identified frozen bits. If the frozen bits also include the CRC bits, masked with the device ID a CRC component 608 can perform a CRC check and facilitate unmasking the device ID.

Figure 7:
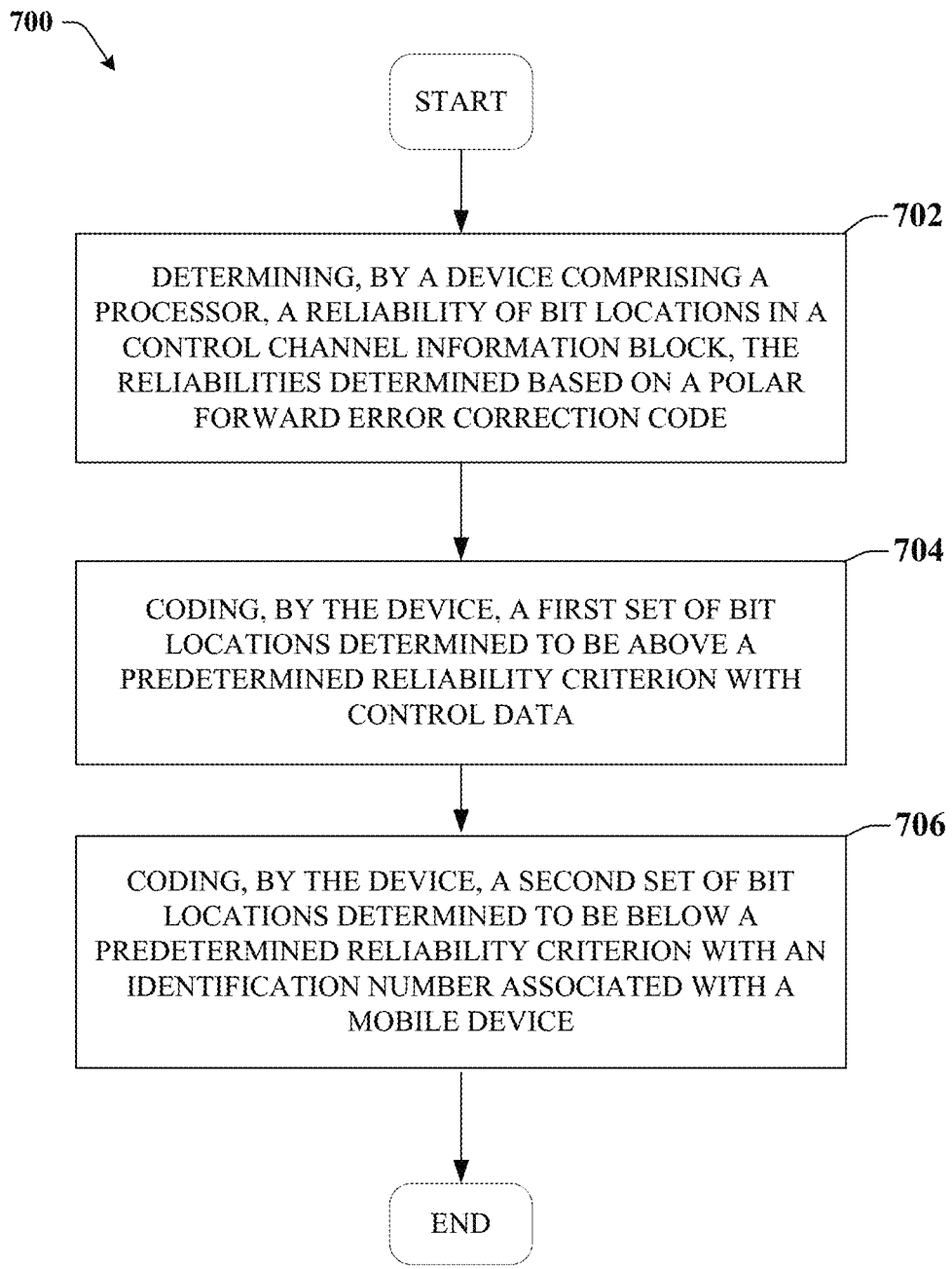
FIG. 7 illustrates an example method for encoding control link channels with polar codes in accordance with various aspects and embodiments of the subject disclosure.
Figure 8:
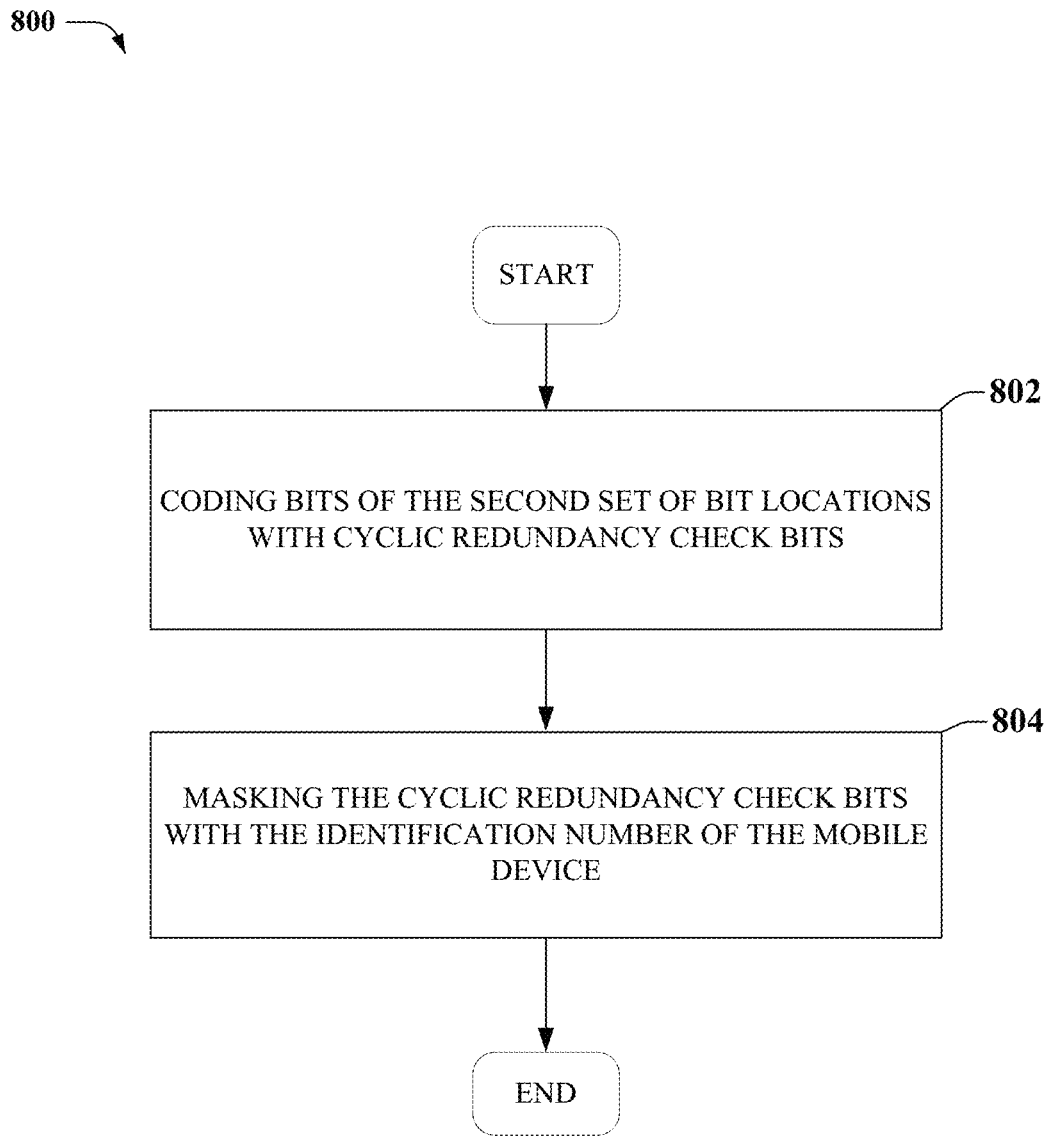
FIG. 8 illustrates an example method for coding frozen bits with cyclic redundancy check bits in accordance with various aspects and embodiments of the subject disclosure.

FIGS. 7-8 illustrates a process in connection with the aforementioned systems. The process in FIGS. 7-8 can be implemented for example by the systems in FIGS. 1-6 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Turning now to FIG. 7, illustrated is an example method 700 for encoding control link channels with polar codes in accordance with various aspects and embodiments of the subject disclosure.

Method 700 can start at 702 where the method includes determining, by a device comprising a processor, respective reliabilities of bit locations in a control channel information block, the reliabilities determined based on a type of polar forward error correction code (e.g., by frozen bit identification component 504).

At 704 the method includes coding, with control data and by the device, a first group of the bit locations determined to have reliabilities above a first reliability threshold, wherein the control data comprises channel state information (e.g., by programming component 506).

At 706, the method includes coding, with an identification number associated with a mobile device and by the device, a second group of bit locations determined to have reliabilities below a second reliability value (e.g., by programming component 506).

Turning now to FIG. 8, illustrated is an example method 800 for coding frozen bits with cyclic redundancy check bits in accordance with various aspects and embodiments of the subject disclosure.

Method 800 can start at 802 where the method includes coding bits of the second group of bit locations with cyclic redundancy check bits (e.g., programming component 506).

At 804 the method includes masking the cyclic redundancy check bits with the identification number of the mobile device.

Figure 9:
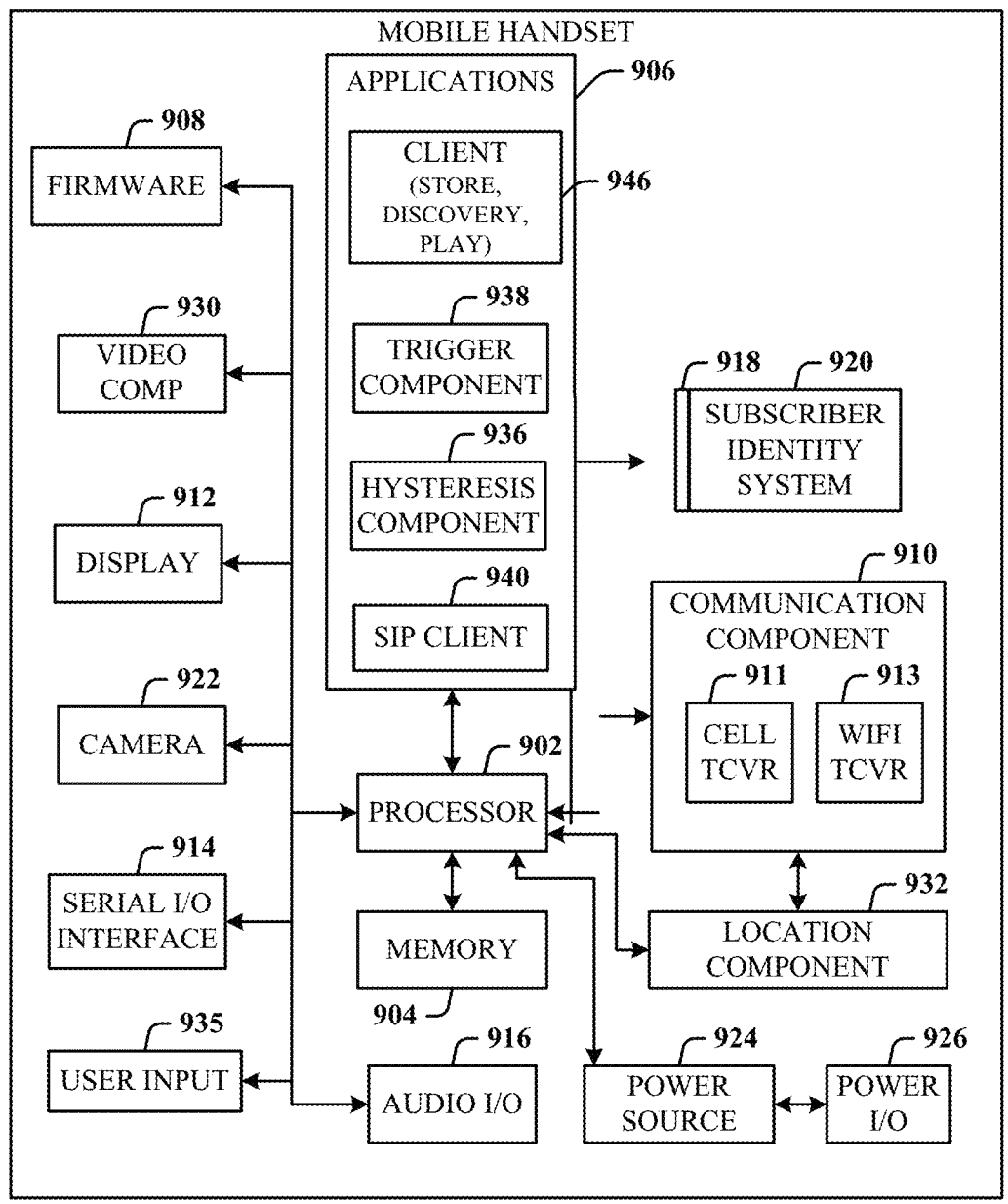
FIG. 9 illustrates an example block diagram of an example user equipment that can be a mobile handset operable to provide adaptive CRC in accordance with various aspects and embodiments of the subject disclosure.

Referring now to FIG. 9, illustrated is a schematic block diagram of an example end-user device such as a user equipment (e.g., mobile device 302 or 304) that can be a mobile device 900 capable of connecting to a network in accordance with some embodiments described herein. Although a mobile handset 900 is illustrated herein, it will be understood that other devices can be a mobile device, and that the mobile handset 900 is merely illustrated to provide context for the embodiments of the various embodiments described herein. The following discussion is intended to provide a brief, general description of an example of a suitable environment 900 in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset 900 includes a processor 902 for controlling and processing all onboard operations and functions. A memory 904 interfaces to the processor 902 for storage of data and one or more applications 906 (e.g., a video player software, user feedback component software, etc.). Other applications can include voice recognition of predetermined voice commands that facilitate initiation of the user feedback signals. The applications 906 can be stored in the memory 904 and/or in a firmware 908, and executed by the processor 902 from either or both the memory 904 or/and the firmware 908. The firmware 908 can also store startup code for execution in initializing the handset 900. A communications component 910 interfaces to the processor 902 to facilitate wired/wireless communication with external systems, e.g., cellular networks, VoIP networks, and so on. Here, the communications component 910 can also include a suitable cellular transceiver 911 (e.g., a GSM transceiver) and/or an unlicensed transceiver 913 (e.g., Wi-Fi, WiMax) for corresponding signal communications. The handset 900 can be a device such as a cellular telephone, a PDA with mobile communications capabilities, and messaging-centric devices. The communications component 910 also facilitates communications reception from terrestrial radio networks (e.g., broadcast), digital satellite radio networks, and Internet-based radio services networks.

The handset 900 includes a display 912 for displaying text, images, video, telephony functions (e.g., a Caller ID function), setup functions, and for user input. For example, the display 912 can also be referred to as a "screen" that can accommodate the presentation of multimedia content (e.g., music metadata, messages, wallpaper, graphics, etc.). The display 912 can also display videos and can facilitate the generation, editing and sharing of video quotes. A serial I/O interface 914 is provided in communication with the processor 902 to facilitate wired and/or wireless serial communications (e.g., USB, and/or IEEE 1394) through a hardwire connection, and other serial input devices (e.g., a keyboard, keypad, and mouse). This supports updating and troubleshooting the handset 900, for example. Audio capabilities are provided with an audio I/O component 916, which can include a speaker for the output of audio signals related to, for example, indication that the user pressed the proper key or key combination to initiate the user feedback signal. The audio I/O component 916 also facilitates the input of audio signals through a microphone to record data and/or telephony voice data, and for inputting voice signals for telephone conversations.

The handset 900 can include a slot interface 918 for accommodating a SIC (Subscriber Identity Component) in the form factor of a card Subscriber Identity Module (SIM) or universal SIM 920, and interfacing the SIM card 920 with the processor 902. However, it is to be appreciated that the SIM card 920 can be manufactured into the handset 900, and updated by downloading data and software.

The handset 900 can process IP data traffic through the communication component 910 to accommodate IP traffic from an IP network such as, for example, the Internet, a corporate intranet, a home network, a person area network, etc., through an ISP or broadband cable provider. Thus, VOID traffic can be utilized by the handset 800 and IP-based multimedia content can be received in either an encoded or decoded format.

A video processing component 922 (e.g., a camera) can be provided for decoding encoded multimedia content. The video processing component 922 can aid in facilitating the generation, editing and sharing of video quotes. The handset 900 also includes a power source 924 in the form of batteries and/or an AC power subsystem, which power source 924 can interface to an external power system or charging equipment (not shown) by a power I/O component 926.

The handset 900 can also include a video component 930 for processing video content received and, for recording and transmitting video content. For example, the video component 930 can facilitate the generation, editing and sharing of video quotes. A location tracking component 932 facilitates geographically locating the handset 900. As described hereinabove, this can occur when the user initiates the feedback signal automatically or manually. A user input component 934 facilitates the user initiating the quality feedback signal. The user input component 934 can also facilitate the generation, editing and sharing of video quotes. The user input component 934 can include such conventional input device technologies such as a keypad, keyboard, mouse, stylus pen, and/or touch screen, for example.

Referring again to the applications 906, a hysteresis component 936 facilitates the analysis and processing of hysteresis data, which is utilized to determine when to associate with the access point. A software trigger component 938 can be provided that facilitates triggering of the hysteresis component 938 when the Wi-Fi transceiver 913 detects the beacon of the access point. A SIP client 940 enables the handset 900 to support SIP protocols and register the subscriber with the SIP registrar server. The applications 906 can also include a client 942 that provides at least the capability of discovery, play and store of multimedia content, for example, music.

The handset 900 can include an indoor network radio transceiver 913 (e.g., Wi-Fi transceiver). This function supports the indoor radio link, such as IEEE 802.11, for the dual-mode GSM handset 900. The handset 900 can accommodate at least satellite radio services through a handset that can combine wireless voice and digital radio chipsets into a single handheld device.

Figure 10:
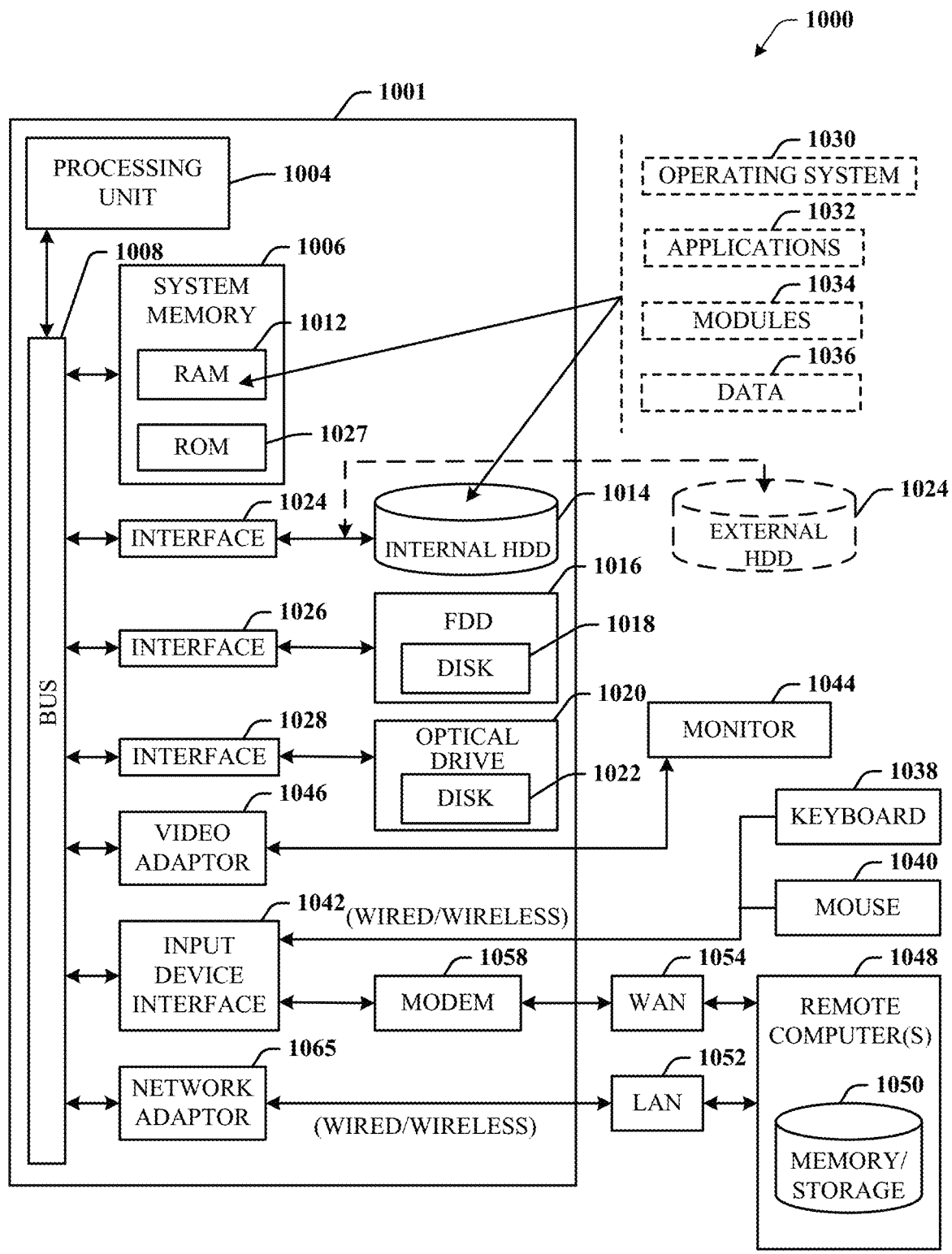
FIG. 10 illustrates an example block diagram of a computer that can be operable to execute processes and methods in accordance with various aspects and embodiments of the subject disclosure.

Referring now to FIG. 10, there is illustrated a block diagram of a computer 1000 operable to execute the functions and operations performed in the described example embodiments. For example, a network node (e.g., network node 306) may contain components as described in FIG. 10. The computer 1000 can provide networking and communication capabilities between a wired or wireless communication network and a server and/or communication device. In order to provide additional context for various aspects thereof, FIG. 10 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1294 interface technologies. Other external drive connection technologies are within contemplation of the subject innovation.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the example operating environment, and further, that any such media can contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 2394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1000 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10 BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprises a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "includes" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:
1. A system, comprising:
a processor; and
a memory that stores executable instructions that, when executed by the processor, facilitate performance of operations, comprising:
determining respective decoding reliabilities of bit locations in a control channel information block;

designating a first subset of the bit locations, having a corresponding first subset of the respective decoding reliabilities that do not satisfy a reliability criterion, as frozen bits; and coding the frozen bits of the control channel information block with an identification number associated with a mobile device.

2. The system of claim 1, wherein satisfaction of the reliability criterion comprises the satisfaction of a defined reliability threshold associated with a decoding reliability.

3. The system of claim 2, wherein the coding of the frozen bits comprises:

ranking the frozen bits according to the corresponding first subset of the respective decoding reliabilities;

selecting a quantity of highest ranked frozen bits of the frozen bits, wherein the quantity is based on a number of bits of the identification number; and coding the quantity of the highest ranked frozen bits with the identification number.

4. The system of claim 1, wherein the coding of the frozen bits comprises:

coding the frozen bits with cyclic redundancy check bits; and masking the cyclic redundancy check bits with the identification number.

5. The system of claim 1, wherein the operations further comprise:

designating a second subset of the bit locations, having a corresponding second subset of the respective decoding reliabilities that satisfy the reliability criterion, as non-frozen bits.

6. The system of claim 5, wherein the operations further comprise:

coding the non-frozen bits of the control channel information block with control data to facilitate a data transmission.

7. The system of claim 1, wherein the determining of the respective decoding reliabilities comprises:

determining the respective decoding reliabilities of the bit locations based on respective estimated signal to noise ratios of the bit locations.

8. A method, comprising:

determining, by a device comprising a processor, respective decoding reliabilities of bit locations in a control channel information block;

designating, by the device, a first group of the bit locations, having corresponding first respective decoding reliabilities of the respective decoding reliabilities that do not satisfy a reliability criterion, as frozen bits; and coding, by the device, the frozen bits of the control channel information block with an identification number associated with a mobile device.

9. The method of claim 8, wherein the reliability criterion comprises whether a decoding reliability satisfies a predetermined reliability threshold.

10. The method of claim 9, wherein the coding of the frozen bits comprises:

ranking the frozen bits according to the corresponding first respective decoding reliabilities;

selecting a number of highest ranked ones of the frozen bits, wherein the number of the highest ranked ones is based on a number of bits in the identification number; and coding the number of the highest ranked ones with the identification number.

11. The method of claim 8, wherein the coding of the frozen bits comprises:

coding the frozen bits with cyclic redundancy check bits; and masking the cyclic redundancy check bits with the identification number.

12. The method of claim 8, further comprising:

designating, by the device, a second group of the bit locations, having corresponding second respective decoding reliabilities of the respective decoding reliabilities that satisfy the reliability criterion, as non-frozen bits.

13. The method of claim 12, further comprising:

coding, by the device, the non-frozen bits of the control channel information block with control data to facilitate a data transmission.

14. The method of claim 8, wherein the determining of the respective decoding reliabilities is based on respective estimated signal to noise ratios of the bit locations.

15. A non-transitory machine-readable storage medium, comprising executable instructions that, when executed by a processor of a device, facilitate performance of operations, comprising:

determining respective decoding reliabilities of bit locations in a control channel information block;

designating first bit locations of the bit locations, determined to have first ones of the respective decoding reliabilities that do not satisfy a reliability criterion, as frozen bits; and coding the frozen bits of the control channel information block with an identification number associated with a mobile device.

16. The non-transitory machine-readable medium of claim 15, wherein the reliability criterion being satisfied comprises a decoding reliability satisfying a reliability threshold.

17. The non-transitory machine-readable medium of claim 16, wherein the coding of the frozen bits comprises:

ranking the frozen bits according to the first ones of the respective decoding reliabilities;

selecting a quantity of highest ranked frozen bits of the frozen bits, wherein the quantity is based on a number of bits represented in the identification number; and coding the quantity of the highest ranked frozen bits as a function of the identification number.

18. The non-transitory machine-readable medium of claim 15, wherein the coding of the frozen bits comprises:

coding the frozen bits with cyclic redundancy check bits; and masking the cyclic redundancy check bits with the identification number.

19. The non-transitory machine-readable medium of claim 15, wherein the operations further comprise:

designating second bit locations of the bit locations, determined to have second ones of the respective decoding reliabilities that satisfy the reliability criterion, as non-frozen bits.

20. The non-transitory machine-readable medium of claim 19, wherein the operations further comprise:

coding the non-frozen bits of the control channel information block with control data to facilitate a data transmission.

* * * * *